(12) United States Patent
    Zantout

(10) Patent No.: US 9,293,848 B2
(45) Date of Patent: Mar. 22, 2016

(54) ELECTRICAL CONNECTOR FOR USE WITH PRINTED CIRCUIT BOARDS

(71) Applicant: IDEAL INDUSTRIES, INC., Sycamore, IL (US)

(72) Inventor: Alan E. Zantout, Sycamore, IL (US)

(73) Assignee: IDEAL Industries, Inc., Sycamore, IL (US)

( * ) Notice: Subject to any disclaimer, the term of this patent is extended or adjusted under 35 U.S.C. 154(b) by 1 day.

(21) Appl. No.: 14/290,328

(22) Filed: May 29, 2014

(65) Prior Publication Data

US 2015/0349446 A1    Dec. 3, 2015

(51) Int. Cl.
    H01R 12/00    (2006.01)
    H01R 12/73    (2011.01)
    H01R 11/01    (2006.01)
    H01R 4/48     (2006.01)

(52) U.S. Cl.
    CPC ............ *H01R 12/732* (2013.01); *H01R 4/4818* (2013.01); *H01R 11/01* (2013.01)

(58) Field of Classification Search
    CPC .... H01R 23/722; H01R 23/725; H01R 13/41; H01R 23/6886; H01R 9/096; H01R 12/57; H01R 23/684; H05K 7/1023; H05K 7/1007; H05K 7/1053; H05K 7/1061; H05K 3/325
    USPC ................ 439/74, 73, 68, 329, 331
    See application file for complete search history.

(56) References Cited

U.S. PATENT DOCUMENTS

| 4,169,642 A | * | 10/1979 | Mouissie ........................ 439/66 |
| 4,595,794 A | * | 6/1986 | Wasserman ............... 174/138 G |
| 4,598,965 A | * | 7/1986 | Bricaud et al. ................. 439/329 |
| 4,669,797 A | * | 6/1987 | Bourdon ........................ 439/353 |
| 4,902,606 A | * | 2/1990 | Patraw .......................... 430/314 |
| 4,998,888 A | * | 3/1991 | Link et al. ........................ 439/73 |
| 5,062,024 A | * | 10/1991 | Hennemann .................. 361/823 |
| 5,135,402 A | * | 8/1992 | Sweeney ........................ 439/71 |
| 5,334,049 A |   | 8/1994 | Kachlic et al. |
| 5,669,783 A | * | 9/1997 | Inoue et al. .................... 439/331 |
| 6,130,821 A | * | 10/2000 | Gerber .......................... 361/704 |
| 6,168,451 B1 | * | 1/2001 | Lin et al. ....................... 439/331 |
| 6,390,475 B1 | * | 5/2002 | Eckblad et al. ............... 277/312 |
| 6,683,789 B1 | * | 1/2004 | Sheynis et al. ................ 361/752 |
| 7,462,036 B2 |   | 12/2008 | Shin et al. |

(Continued)

FOREIGN PATENT DOCUMENTS

WO    2013/192418 A2    12/2013

OTHER PUBLICATIONS

ISA/US, International Search Report and Written Opinion issued on PCT application No. US15/33227, dated Oct. 26, 2015, 12 pages.

*Primary Examiner* — Abdullah Riyami
*Assistant Examiner* — Vladimir Imas
(74) *Attorney, Agent, or Firm* — Greenberg Traurig, LLP

(57) ABSTRACT

An electrical connector has one or more body portions in which is disposed an electrical terminal having at least one contact pad interface for coupling to a contact pad of at least one printed circuit board (PCB). The body has an associated fastening device which is used to mechanically and electrically couple the electrical connector to the at least one PCB. The electrical connector may be provided with a full or partial hourglass-like shape, when viewed from the side and/or from above, to facilitate its use with a PCB that carries a source of light, such as an LED.

46 Claims, 19 Drawing Sheets

VERY low profile connector height around LED's. This is beneficial for viewing angle, shadowing, of LED light.

(56) References Cited

U.S. PATENT DOCUMENTS

| | | |
|---|---|---|
| 7,666,002 B2 * | 2/2010 | Lin et al. .............. 439/73 |
| 7,892,022 B2 | 2/2011 | Mostoller et al. |
| 8,025,507 B2 | 9/2011 | Kim et al. |
| 8,197,082 B2 | 6/2012 | Cho et al. |
| 8,764,457 B2 * | 7/2014 | Chen et al. .............. 439/65 |
| 2005/0208797 A1 | 9/2005 | Duncan et al. |
| 2005/0230943 A1 * | 10/2005 | Thomas .............. 280/731 |
| 2008/0171451 A1 | 7/2008 | Shin et al. |
| 2011/0207372 A1 | 8/2011 | Breen, IV |
| 2013/0072038 A1 * | 3/2013 | Chen et al. .............. 439/65 |

* cited by examiner

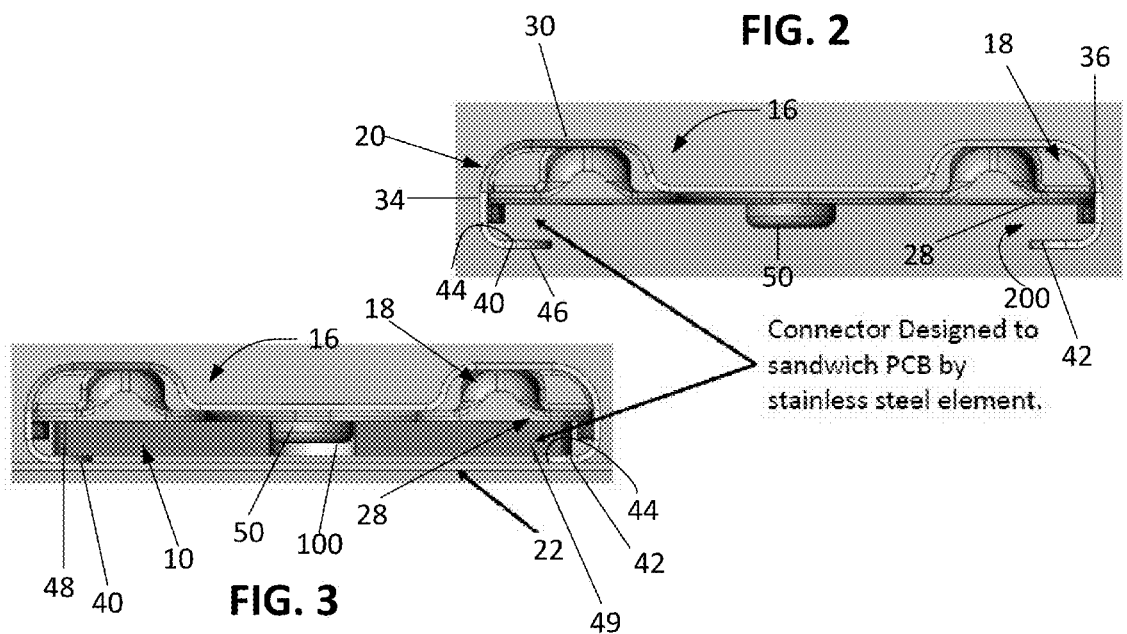

FIG. 7
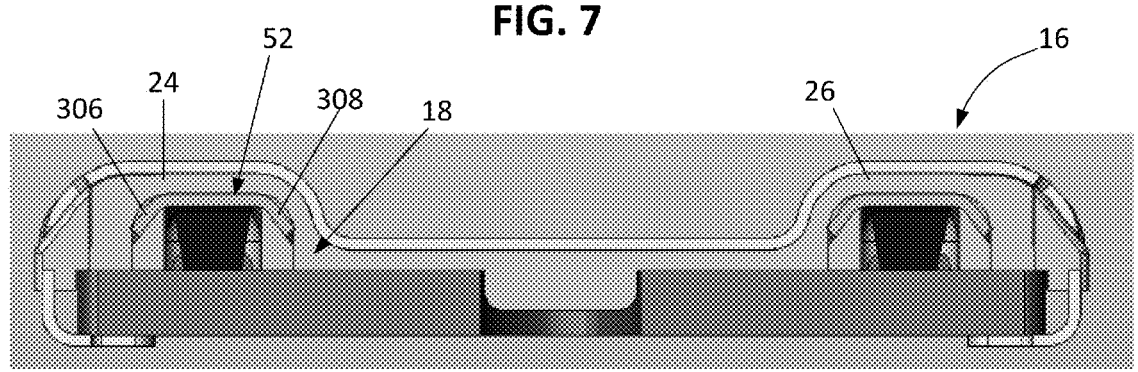
Cross section with and without PCB
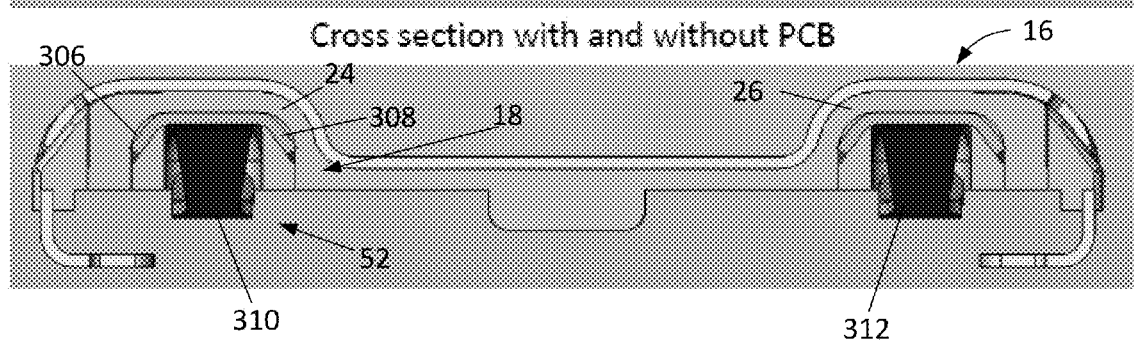
FIG. 6

FIG. 14A
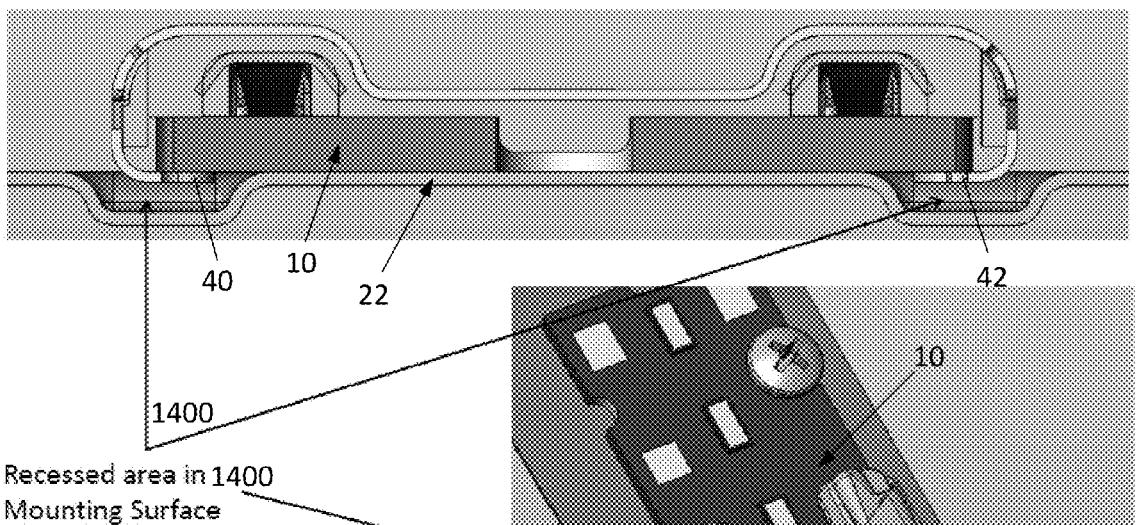
40  10  22  42
1400
Recessed area in 1400
Mounting Surface
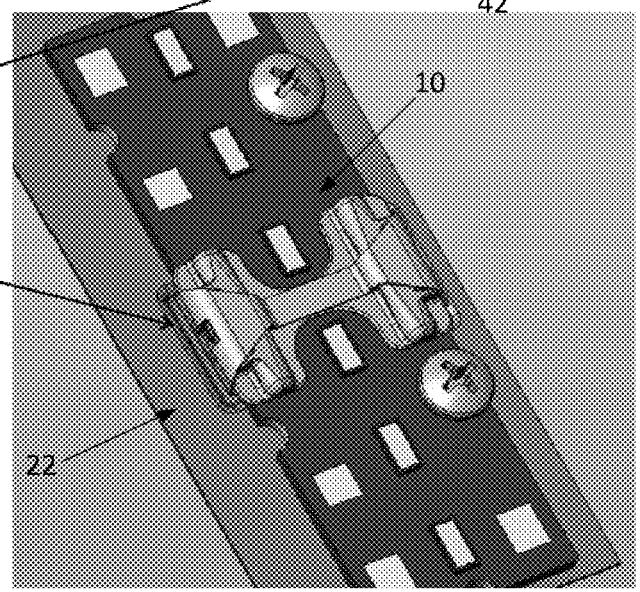
FIG. 14B

ELECTRICAL CONNECTOR FOR USE WITH PRINTED CIRCUIT BOARDS

FIELD OF THE DISCLOSURE

The following generally relates to electrical connectors and more particularly to electrical connectors for use with printed circuit boards.

BACKGROUND OF RELATED ART

Connectors, and, more particularly, connectors capable of electrically connecting printed circuit boards ("PCBs") to one another are generally known in the art. For example, U.S. Pat. No. 7,892,022, entitled "Jumper Connector for a Lighting Assembly," describes a connector for electrically connecting PCBs on which are mounted a plurality of light emitting diodes ("LEDs"). The described connector includes a connector body having a mating surface configured to engage more than one PCB. The connector body is configured to be secured to a substrate by a fastener. The connector body additionally includes a conductor and the conductor is configured to be electrically connected to the PCBs during the same step in which the connector body is secured to the substrate. In this manner, the connector body engages the outer surface of the PCBs and simultaneously forces the inner surface of the PCBs into thermal contact with the substrate.

U.S. Pat. No. 7,462,036, entitled "Printed Circuit Board Connector for Back Light Unit and Chassis Using the Same," also describes a connector for electrically connecting PCBs on which are mounted a plurality of light emitting diodes ("LEDs"). The described connector includes a horizontal supporter, a vertical supporter that divides the horizontal supporter into first and second areas, and at least one connecting terminal formed on the horizontal supporter which is partially exposed in each of the first and second areas of the horizontal supporter. The connecting terminal functions to electrically connect PCBs each having one end placed on the first and second areas, respectively.

U.S. Published Application No. 2011/0207372, entitled "Electrical Connector With Push-in Termination," describes an edge connector having a first portion adapted to receive an edge of a PCB and a second portion adapted to receive a least one conductor of a stripped end of a wire. The first portion includes at least one terminal assembly and the terminal assembly includes a retention member adapted to engage the conductor via a push-in type wire termination. The second portion includes a terminal portion adapted to releasably engage a contact on a PCB.

U.S. Pat. No. 8,025,507, entitled "Connector," describes a connector for a printed circuit board having a guide hole and a locking hole to receive the connector. The connector includes a housing which is mounted on the printed circuit board, a guide inserted into the guide hole, and a locking unit inserted into the locking hole. Each of the guide and locking unit protrude from the bottom of the housing. In one example, the guide slides into the guide hole and locks into place over the PCB. In another example, the connector snaps into the PCB. In either instance, to remove the PCB from the support structure underlying the connector, the connector must be removed from the PCB and from the support structure in order to provide access the PCB, thus presenting an often-times labor-intensive task.

While the connectors described in each of these publications, which are incorporated herein by reference in their entirety, generally work for their intended purpose, the following describes improved connectors for use with PCBs.

SUMMARY

Described hereinafter are improved connectors for use with PCBs. By way of example, the electrical connector has a body that is positionable over a top surface of the at least one PCB. The body has a first body portion in which is disposed a first electrical terminal having at least a first contact pad interface, a second body portion in which is disposed a second electrical terminal having at least a second contact pad interface, and an intermediate body portion which connects the first body portion to the second body portion. A width and/or a height of the intermediate body portion is preferably less than a respective width and/or a height of the first body portion and the second body portion. The first and second contact pad interfaces are electrically coupled to contact pads of the at least one PCB when the body is coupled to the at least one PCB.

A fastening element is also preferably associated with the body. The fastening element has a first side having a first element and second side having a second element. The first and second sides are arranged to be positionable adjacent to respective first and second sides of the at least one PCB. The first element of the first side and the second element of the second side are further arranged to inwardly extend from the respective first side and second side to resiliently engage a bottom surface of the at least one PCB to thereby mechanically and electrically couple the body and the at least one PCB without use of/need for an additional fastening element.

In a further described example, the body portion is provided with a single body portion having an electrical terminal. The single body portion is linked to a holding element that is cooperable with a corresponding element formed in one or more PCBs. A fastening element is also provided. The fastening element and the holding element (operating in cooperation with the corresponding element formed in the one or more PCBs) function to mechanically and electrically couple the body to the one or more PCBS. The holding element and corresponding element formed in the one or more PCBs also function inhibit movement of the body portion is at least two planar directions. The body can be arranged as above to prevent light interference with any LEDs carried by the PCBs, to be used as a jumper or a wire connector, etc.

While the foregoing provides a general description of the subject assemblies for holding a source of LED light and some advantages thereof, a better understanding of the objects, advantages, features, properties, and relationships of the subject assemblies will be obtained from the following detailed description and accompanying drawings which set forth illustrative examples and which are indicative of the various ways in which the principles of the invention may be employed.

BRIEF DESCRIPTION OF THE DRAWINGS

FIG. 2 is a side view of the exemplary connector of FIG. 1;

FIG. 3 is a side view of the exemplary connector of FIG. 1 showing how a PCB may be arranged therein;

FIG. 6 is a cross-sectional side view of the exemplary connector of FIG. 1;

FIG. 7 is a cross-sectional side view of the exemplary connector of FIG. 1 with a PCB arranged therein;

FIGS. 12A, 12B, 13A, 13B, 14A, and 14B illustrate exemplary methods for adapting a mounting surface for use with the exemplary connector of FIG. 1;

DETAILED DESCRIPTION

The following description of exemplary connectors and methods for using the same are not intended to limit the scope of the description to the precise form or forms detailed herein. Instead the following description is merely intended to be illustrative so that others may follow its teachings.

Figure 1:
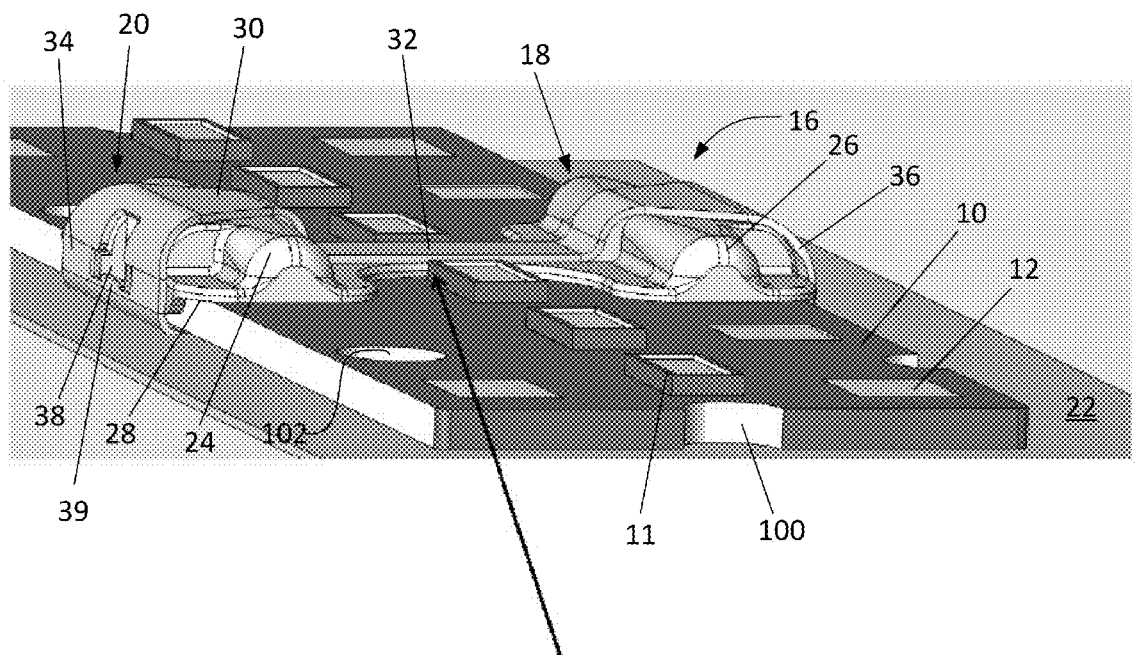
FIG. 1 is a perspective view of an exemplary connector constructed according to the description which follows wherein the exemplary connector is connected to PCBs.

Turning now to the figures, wherein like elements are referenced using common identifiers, illustrated are exemplary connectors for use in connection with one or more printed circuit boards ("PCBs"). By way of non-limiting example, the PCBs 10, examples of which are illustrated in FIG. 1, may have mounted thereon one or more light emitting diodes ("LEDs") 11 which are, in turn, electrically coupled to one or more contact pads 12 formed on a top side of the PCBs 10. The PCBs 10 are also provided with PCB apertures, slots, or the like 102 for use in receiving a fastener that is intended to be used to securely fasten the PCBs 10 to a mounting surface 22, such as a heat sink.

FIG. 1 also illustrates an exemplary connector 16 for use in electrically and mechanically coupling the PCBs 10 that are to be mounted upon the mounting surface 22. The exemplary connector 16 includes a housing 18 and an attachment element 20. The housing 18 is preferably formed using an electrically insulating material, such as plastic, while the attachment element 20 is preferably formed using stainless steel or the like. Regardless of the material used to construct the attachment element 20, in some embodiments it is preferred that at least the ends of the attachment element 20 be formed from a resilient material that can be temporarily deflected and which will thereafter restore.

As further illustrated in FIG. 1, the housing includes a bottom surface 28 that will be placed over the top side of the PCBs 10 and the attachment element 20 includes a top surface 30, having a depressed center portion 32, and two side walls 34, 36 whereby the attachment element 20 follows the elevations and overall "hour glass" like shape (shown in FIG. 5) of the housing 18, i.e., the center portion 32 is provided with a height that is less than a height that is provided to the two housing portions 24, 26. As will be appreciated, the depressed center portion 32 and overall shape provided to the connector 16 functions to give the connector 16 a low profile to thereby prevent the connector 16 from shadowing light emitted by the LEDs 11. The two domed portions 24, 26 that are arranged parallel to each other carry electrical terminals.

For use in coupling the connector 16 with a PCB, as will be described hereinafter, one or both of the side walls 34, 36 may optionally include a tool receiving slot 38. The tool receiving slot 38 may be of sufficient size and shape to permit a tool to be inserted into the slot 38 whereby the tool can be used to interact with a release tab 39 provided therein for the purpose of providing a means for allowing a user remove the attachment element 20 from and/or couple the attachment element 20 PCBs 10. Considering the description which follows, one having ordinary skill in the art will appreciate that the tool slot 38 may be configured to accommodate a wide range of appropriate tools, including, for example, a screwdriver.

While the above connector 16 is described as having a single housing element 18 having a pair of domed elements for use in carrying the electrical terminals, it will be appreciated that plural housing elements can be used for this same purpose. A also described hereinafter, a connector having a single domed housing element is also contemplated. Furthermore, while the connector 16 is described as having a housing element 18 and a separate attachment element 20, it will be appreciated that the housing element 18 and the attachment element 20 can be unitarily formed. Accordingly, it is to be understood that the above described connector 16 can be provided with alternative constructions that will still be capable of performing some or all of the functions described herein.

Referring now to FIGS. 2 and 3, the attachment element 20 of the connector 16 is further provided with sandwiching elements 40, 42. The sandwiching elements 40, 42 (which may comprise one or more elements arranged as described hereinafter) are specifically provided for use in maintaining the connector 16 in electrical and mechanical engagement with the PCBs 10. As illustrated, the sandwiching elements 40, 42 are arranged to inwardly extend from a bottom of respective side walls 34, 36 in a direction that is generally parallel to the top 30 of the attachment element 20. The sandwiching elements 40, 42 include a top surface 44 and a bottom surface 46. In this manner, when the exemplary connector 16 is connected to the PCBs 10, i.e., when the PCBs are inserted into gaps 200 formed between the housing 18 and the sandwiching elements 40, 42 of the attachment element 20, the top surface 44 of the sandwiching elements 40 will engage the bottom surface of the PCBs 10 and the top surface of the PCBs 10 will engage with the bottom 28 of the housing, particularly the electrical terminals carried therein, such that the PCBs 10 will be "sandwiched" within the connector 16 between the housing 18 and the sandwiching elements 40, 42. Preferably, the sandwiching elements 40, 42 are resilient such that, when the sandwiching elements 40, 42 are placed into engagement with the underside of the PCBs 10, the sandwiching elements 40, 42 will force the PCBs 10 against the underside of the housing 18, e.g., the gap 200 is preferably sized no larger than the width of the PCB 10 that is to be placed therein.

In one example of the disclosed connector, the housing 18 may optionally include an alignment feature 50 for keeping the PCBs 10 (shown in FIG. 1) centered and for preventing movement of the PCBs 10 relative to the connector 16, e.g., left and right and up and down sliding is a plane that is defined by the PCBs. To this end, the alignment feature 50 is configured to fit snugly within an alignment space that is formed when the alignment slots 100 (shown in FIG. 8) of two PCBs 10 are positioned together. The alignment feature 50 of the illustrated example is cylindrical in shape. However, one having ordinary skill in the art will appreciate that the alignment feature 50 may be formed into any appropriate three-dimensional shape that will generally correspond to a shape that will be formed by any alignment slots provided to the PCBs 10.

Referring now to FIG. 3, the example connector 16 of FIG. 2 is shown with a PCB 10 arranged therein. As discussed above, the configuration of the example connector 16 functions so that the ends 48, 49 of the PCB 10 are "sandwiched" between the tops 44 of the sandwiching elements 40, 42 and the bottom 28 of the housing 18.

Figure 4:
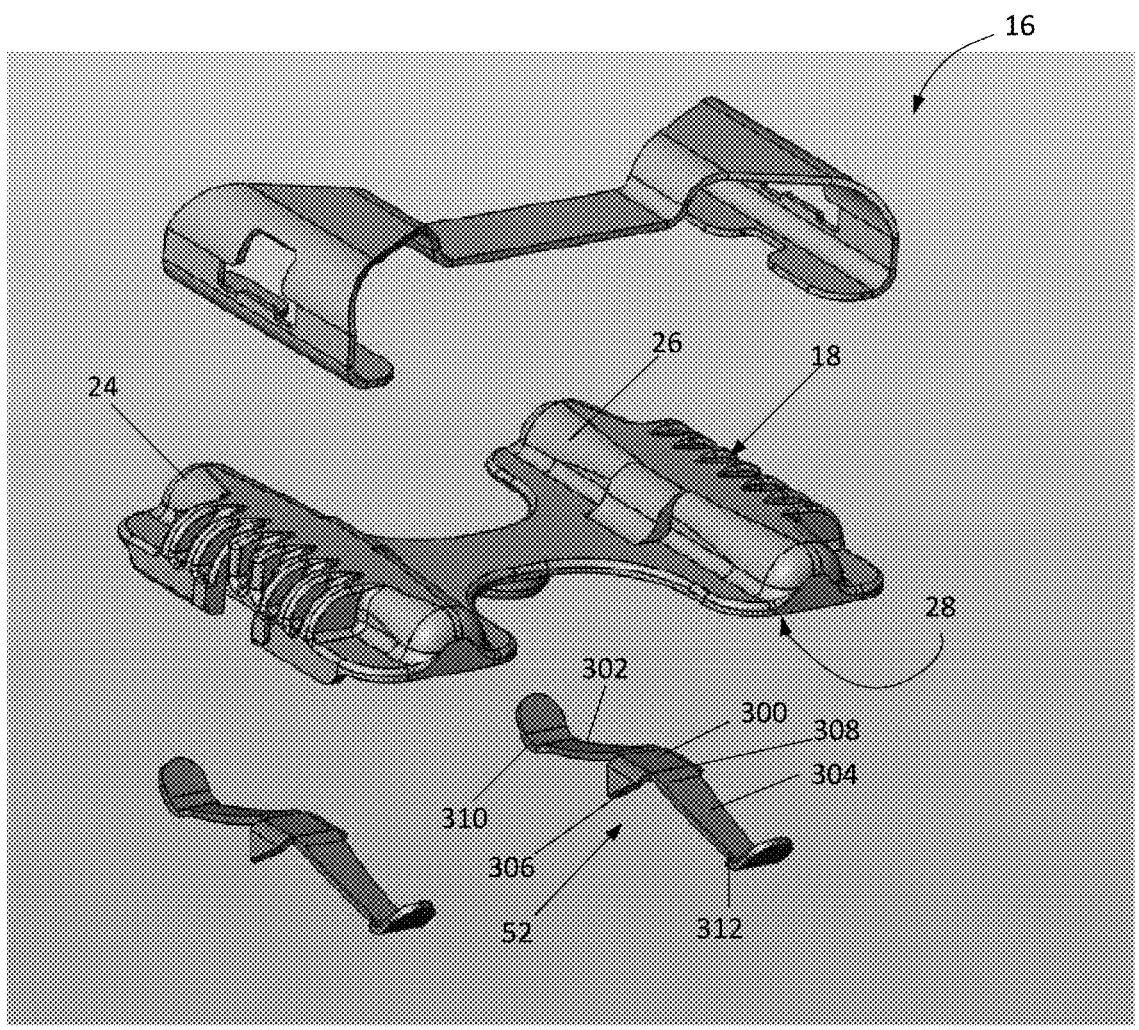
FIG. 4 is an exploded perspective view of the exemplary connector of FIG. 1.

Referring now to FIG. 4, the exemplary connector 16 includes a pair of electrical terminals 52. The conductors 52 include a base portion 300 having two opposed, resilient arms 302, 304. While not required, the electrical terminals 52 are preferably housed entirely within the length of the domes 24, 26 to thereby prevent inadvertent contact with the electrical terminals 52 when the connector 16 is installed on the mounting surface 22 with the PCBs 10. The resilient arms 302, 304 define first and second contact pad interfaces 310, 312, respectively, of the electrical terminal 52. The contact bad interfaces 310, 312 are preferably biased towards engagement with the corresponding electrical contact pads provided to the PCBs 10 and, as such, will function to electrically couple the electrical contract pads of the PCBs 10 to which the connector 16 is mated. The electrical terminals 52 can be molded into the housing 18, can be engaged with holding elements provided to the housing 18, etc. as desired for any particular purpose. Thus, it is to be understood that other forms for the electrical terminals 52 and/or for the housing 18 are contemplated and that the illustrated example is not intended to be limiting.

Figure 5:
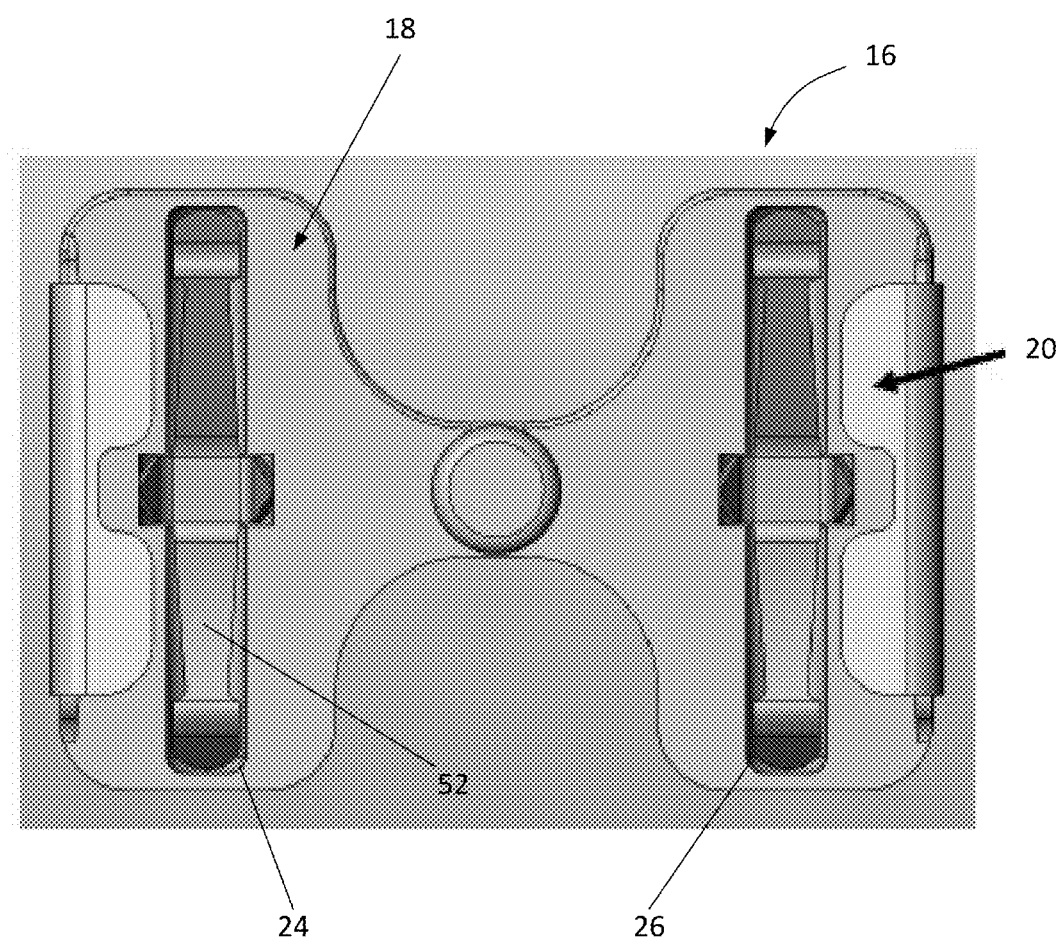
FIG. 5 is a bottom view of the exemplary connector of FIG. 1.

More particularly, the first contact pad interface 310 is configured and arranged to electrically engage a contact pad 12 (shown in FIG. 1) of one PCB 10 while the second contact pad interface 312 is configured and arranged to electrically engage a contact pad 12 of an adjacent PCB 10. As such, the electrical terminal 52 creates an electrical path or bridge between the two PCBs 10. The resilient arms 302, 304 are arranged so as to be caused to deflect upward toward the plane defined by the base 300 during mating with the PCBs 10 and, in this manner, will be biased into engagement with the contact pads of the PCBs 10. To facilitate a good electrical connection with the contact pads of the PCBs 10, the electrical terminals 52 may be arranged to emerge slightly from the domes 24, 26 such that the contact pad interfaces 310, 312 are normally exposed below the bottom 28 of the housing 18 for engagement with the contact pads 12 of the PCBs 10. By way of example only, to hold the electrical terminals 52 within the housing 18, the electrical terminals 52 may include two pointed flanges 306, 308 that are intended to be engaged with corresponding features provided to the housing 18 when the electrical terminals 52 are placed within the respective housing domes as shown in FIGS. 5-7. As noted above, other means for arranging the electrical terminals 52 relative to the housing 18 are also contemplated.

FIG. 6 is a cross section view of one example of the connector 16 illustrating the electrical terminals 52 emerging slightly from the domes 24, 26 such that the contact pad interfaces 310, 312 are normally exposed below the bottom 28 of the housing 18. FIG. 7 illustrates the example connector 16 of FIG. 6 with a PCB 10 inserted into the connector 16 with the contact pad interfaces being biased into electrical connection with the PCBs 10. FIGS. 6 and 7 also illustrate the example pointed flanges 306, 308 that are provided to keep the electrical terminals 52 immobilized within the domes 24, 26 of the housing 18.

Figure 8:
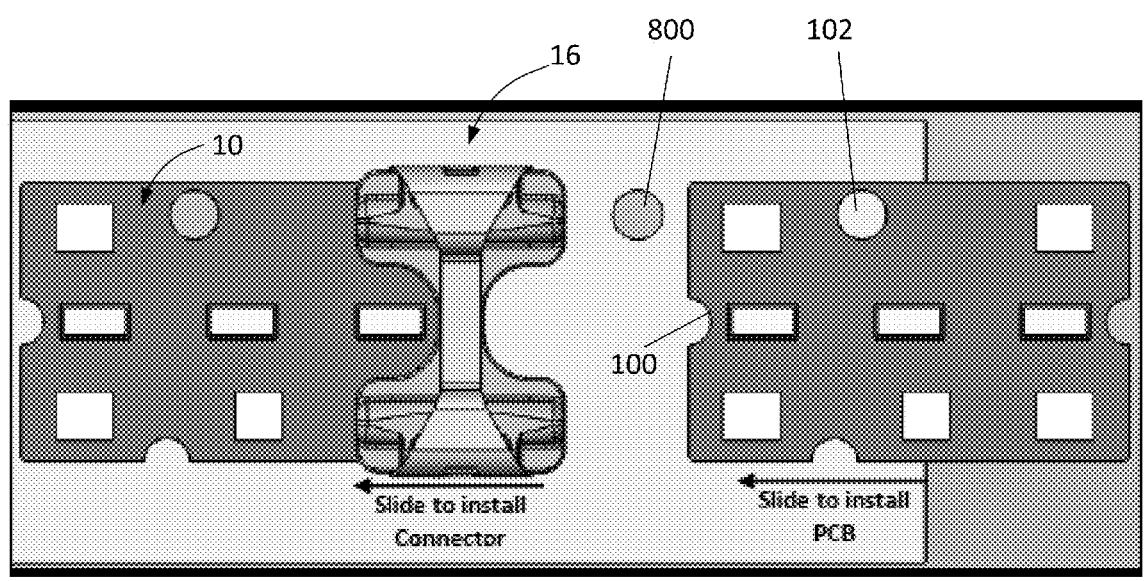
FIG. 8 illustrates an exemplary method for connecting the exemplary connector of FIG. 1 with PCBs.

Referring now to FIG. 8, there is illustrated an example sliding installation method for the example connector 16. In the example method, a user may arrange the first PCB 10 so that the PCB aperture 102 aligns with a corresponding mounting surface aperture 800. Once the first PCB 10 is aligned, the user slides one or both of the connector 16 and the first PCB 10 towards each other until the first PCB 10 reaches approximately the mid-point of the connector 16, or until the alignment slot 100 contacts the alignment feature 50 (shown in FIG. 2). Once the connector 16 is coupled to the first PCB 10, the user uses a sliding motion to arrange a second PCB 10 within the opposite side of the connector 16 until the second PCB 10 is located at approximately the mid-point of the connector 16, or until the alignment slot 100 contacts the alignment feature 50. To remove the PCBs 10, the user may reverse these installation method steps. It will also be understood that these steps may be performed in a different order as desired to achieve the same objective of mounting the assembly to the mounting surface 22.

Figure 9:
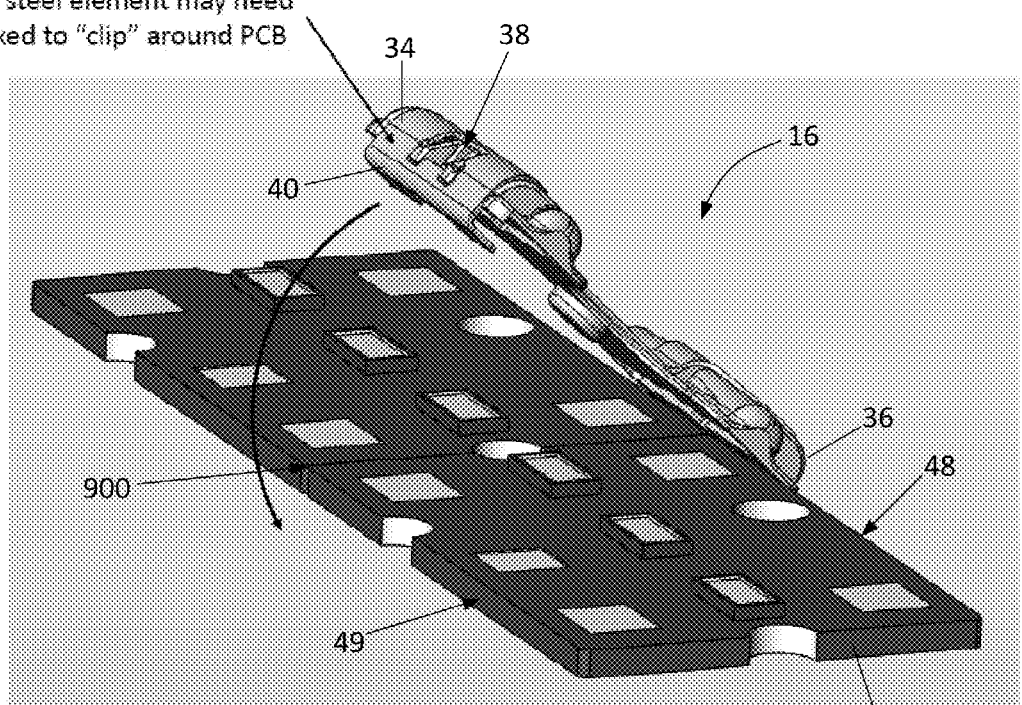
FIG. 9 illustrates a further exemplary method for connecting the exemplary connector of FIG. 1 with PCBs.

FIG. 9 illustrates a rotational installation method for the example connector 16. In the example method, two PCBs 10 are provided together in alignment. The user aligns the connector 16 above the PCBs 10 along the axis 900 designated by the intersection of the two PCBs 10. The user then places the sandwiching element 40 of the first side 36 of the connector 16 at least partially under a first end 48 of the PCBs 10 and raises the second side 34 of the connector 16 above the PCBs 10. Next, the user moves the sandwiching element 40 of the second side 34 outwardly so that the sandwiching element 40 is positioned to allow the attachment element to be positioned over a second end 49 of the PCBs 10 without dislodging the sandwiching element 40 of the first side 36 from under the first end 48 of the PCBs 10. In the illustrated example, the user deflects the second side 34 by placing an appropriate tool, for example, a screwdriver, into the tool slot 38 of the second side 34 of the connector 16 while interacting with the tab 39 to move the sandwiching element 40 away from the housing 16. One having ordinary skill in the art will appreciate that the connector 16 may be provided with tool slots 38 on one side 34 or both sides 34, 36 of the connector 16. Additionally, one having ordinary skill in the art will appreciate that the entirety of the connector 16 may be made of a resilient material such that the sandwiching element(s) 40 may be manually bent outwards so that the PCBs 10 may be positioned therewithin. In such a case, the need for providing the slots 38 and tab 39 may be eliminated. With the second side 34 deflected outwardly, the user rotates the connector 16 downwardly towards the second end 49 of the PCBs 10. Once the sandwiching element 40 of the second side 34 can be positioned under the surface of the PCBs 10, the user allows the sandwiching element 40 of the second side 34 to return to a position under the second end 49 of the PCBs 10. The user may then remove the tool from the tool slot 38.

While FIG. 9 illustrates a rotational installation method which relies upon the user actively deflecting one of the sides 34 and 36, it will be understood that the both of the sides 34 and 36 can be actively deflected by a user to thereby facilitate a vertical installation method, i.e., a method in which the connector 16 is moved in a downward direction when being coupled to the PCBs 10. In such a method, it is contemplated that the user would again align the connector 16 above the PCBs 10 along the axis 900 designated by the intersection of the two PCBs 10. The user can then bend the connector 16 (or otherwise manipulate the connector 16) to thereby move each of the sandwiching element 40 of the second side 34 and the sandwiching element 42 of the first side 36 outwardly so that the sandwiching elements 40 and 42 are spaced apart a distance that is greater than the width of the PCBs 10. The connector 16 can then be moved in a downward direction that is tangential to axis 900 until the connector 16 is positioned upon the PCBs 10 as desired. The mechanical manipulation that is provided to the connector 16 for the purpose of actively deflecting the sandwiching elements 40 and 42 can then be released whereupon the sandwiching elements 40 and 42 will restore to their natural position which will now be underlying the PCBs 10. Once installed in this manner, the connector 16 will have the same mechanical and electrical coupling with the PCBs 10 as described above.

Figure 10:
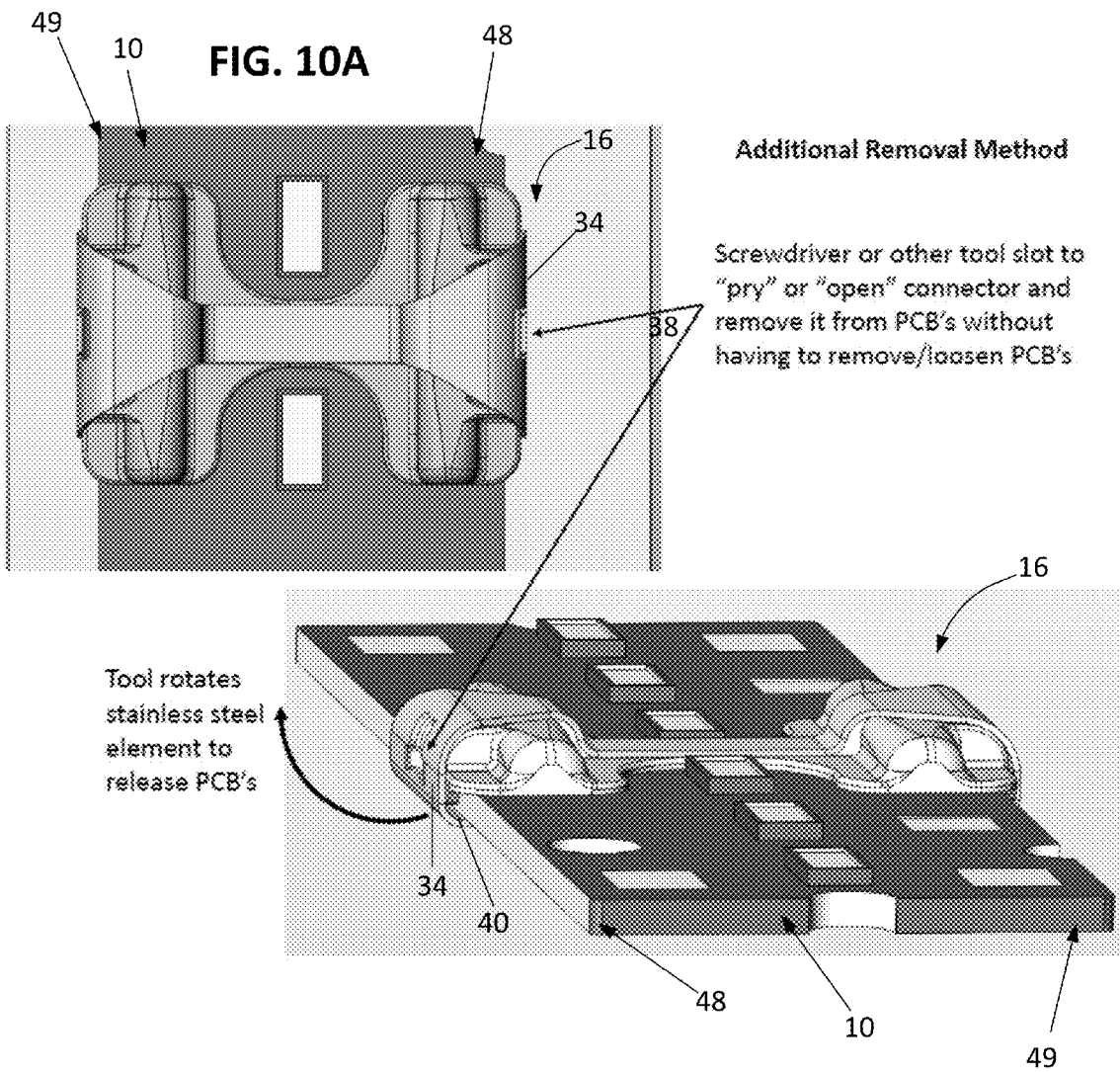
FIGS. 10A and 10B together illustrate an exemplary method for releasing the exemplary connector of FIG. 1 from PCBs.

FIGS. 10A and 10B illustrate an additional example removal method for the connector 16. In the illustrated example, the user deflects the side 34 of the connector 16 by placing an appropriate tool, for example, a screwdriver, into the tool slot 38. Using leverage upon the tab 39 within the tool slot 38, the user deflects the side 34 outwardly. The user continues to deflect the side 34 until the sandwiching element 40 may be removed from under the end 48 of the PCBs 10. Once the sandwiching element 40 has been removed from under the end 48 of the PCBs 10, the user may simply slide the connector 16 off of the other end 49 of the PCBs 10.

Figure 11:
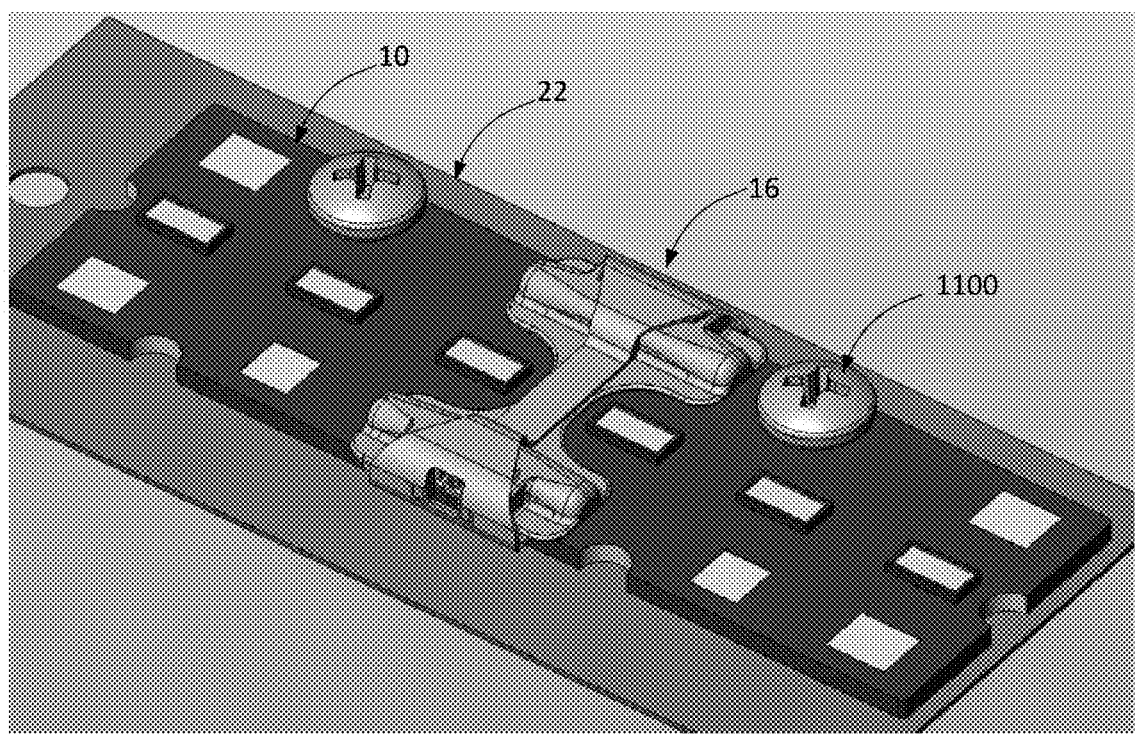
FIG. 11 is a perspective view of the exemplary connector of FIG. 1 and PCBs as attached to a mounting surface.

FIG. 11 illustrates an example of the connector 16 and two PCBs 10 mounted on the mounting surface 22. In the illustrated example, the PCBs 10 are securely fastened to the mounting surface 22 with screws 1100. The screws 1100 are to be passed through the PCB aperture 102 (shown in FIG. 1) and placed into engagement with the mounting surface, for example by being screwed into a threaded aperture 800 provided to the mounting surface 22, (shown in FIG. 8). One having ordinary skill in the art will appreciate that other types of fasteners and fastening arrangements can be used for this same purpose. Once attached in this manner the connector 16, particularly the sandwiching elements thereof, will be, in effect, trapped between the PCBs 10 and the mounting surface 22 thus further securing the connector 16 to the PCBs 10.

Figures 12A, 12B:
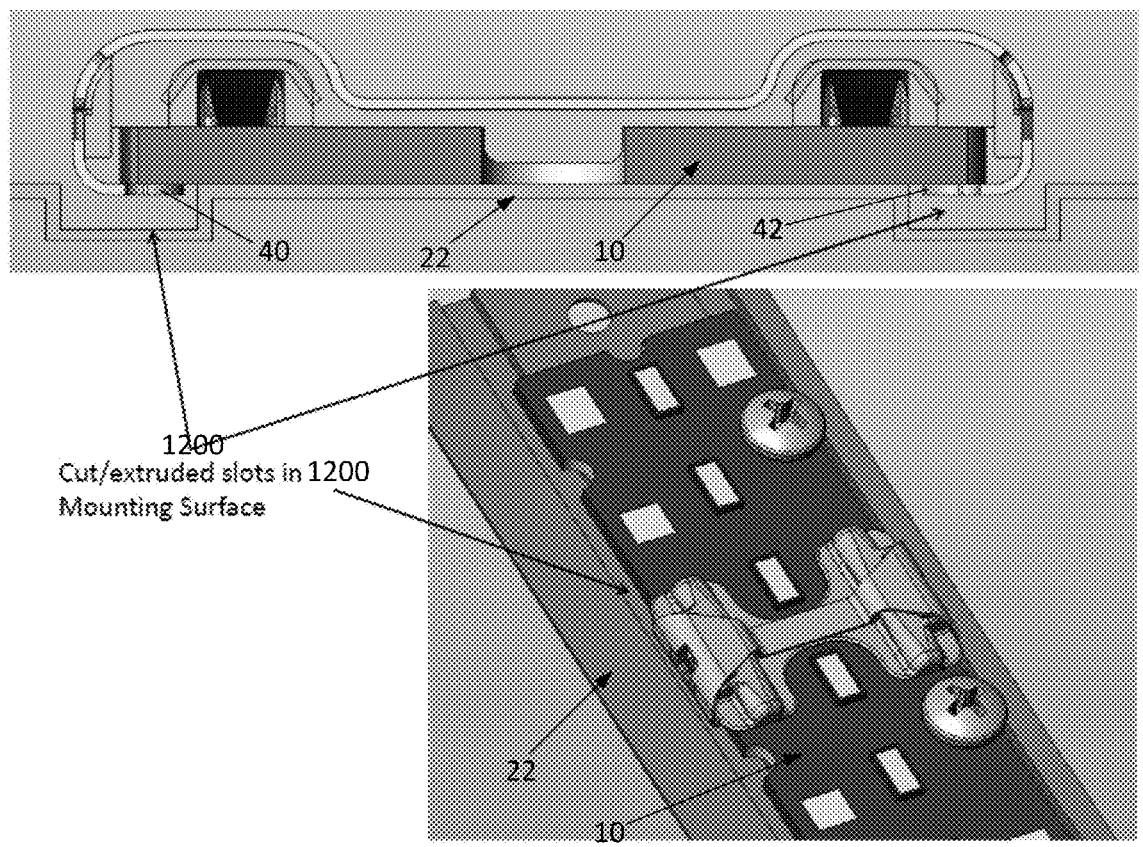
Figures 13A, 13B:
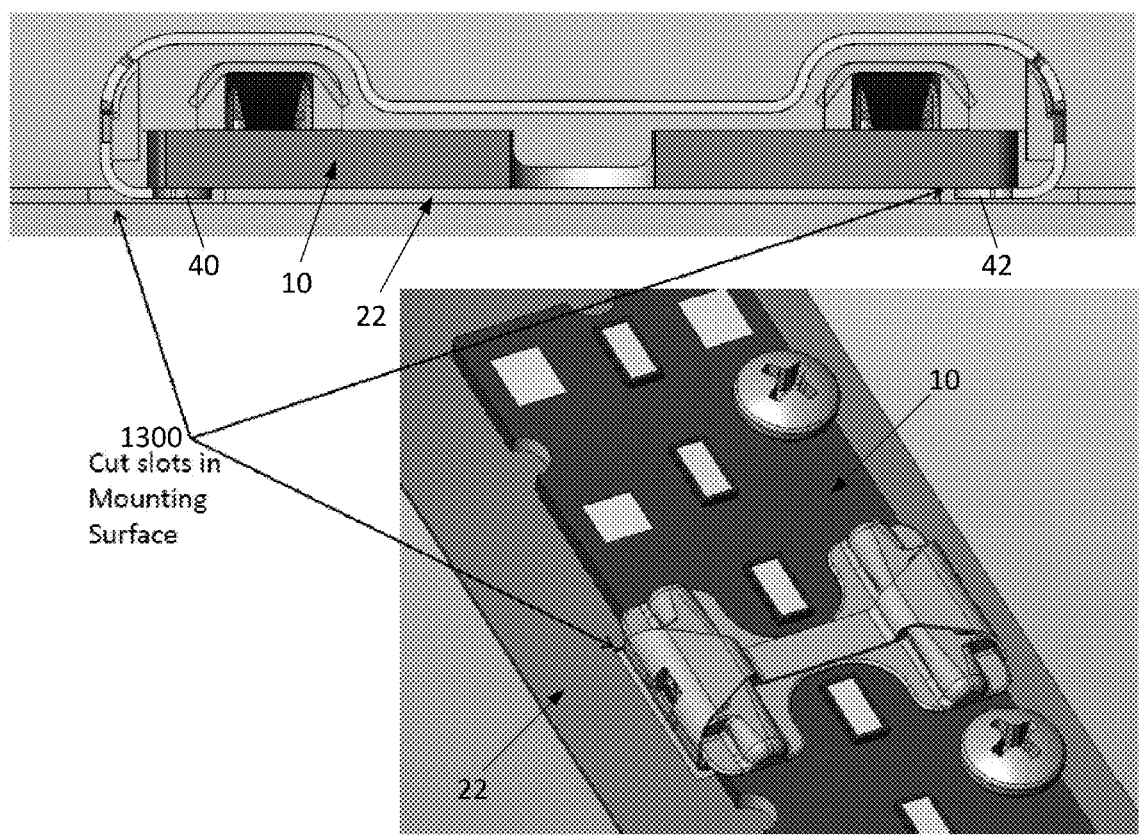

Returning to FIG. 3, there is illustrated an example mounting configuration wherein the bottoms 46 of the sandwiching elements 40, 42 rest directly on the mounting surface 22 so that the PCBs 10 are raised slightly above the mounting surface 22. In this embodiment, space is provided under the PCBs 10 through which air may pass. It will also be appreciated that a heat conductive element can be inserted within the space as desired. Turning to FIGS. 12A and 12B, there is illustrated a second example mounting configuration wherein the sandwiching elements 40, 42 are placed into parallel extruded channels 1200 running the length of the mounting surface 22 so that the PCBs 10 will be positioned so as to lie directly on the mounting surface 22, e.g., so that the PCBs are placed into direct thermal engagement with the mounting surface 22. Turning to FIGS. 13A and 13B, there is illustrated a third example mounting configuration wherein the sandwiching elements 40, 42 are recessed into cut slots 1300 formed out of the mounting surface 22 so that the PCBs 10 will be positioned so as to lie directly on the mounting surface 22. Turning to FIGS. 14A and 14B, there is illustrated a fourth example mounting configuration wherein the sandwiching elements 40, 42 are recessed into wells 1400 formed into the mounting surface 22 so that the PCBs 10 will be positioned so as to lie directly on the mounting surface 22. In any of these arrangements, it is preferred that any slots, grooves, or the like provided to the mounting surface 22 are such that it will be difficult to remove the sandwiching elements of the connector 16 from between the PCBs 10 and the mounting surface 22.

Figure 15:
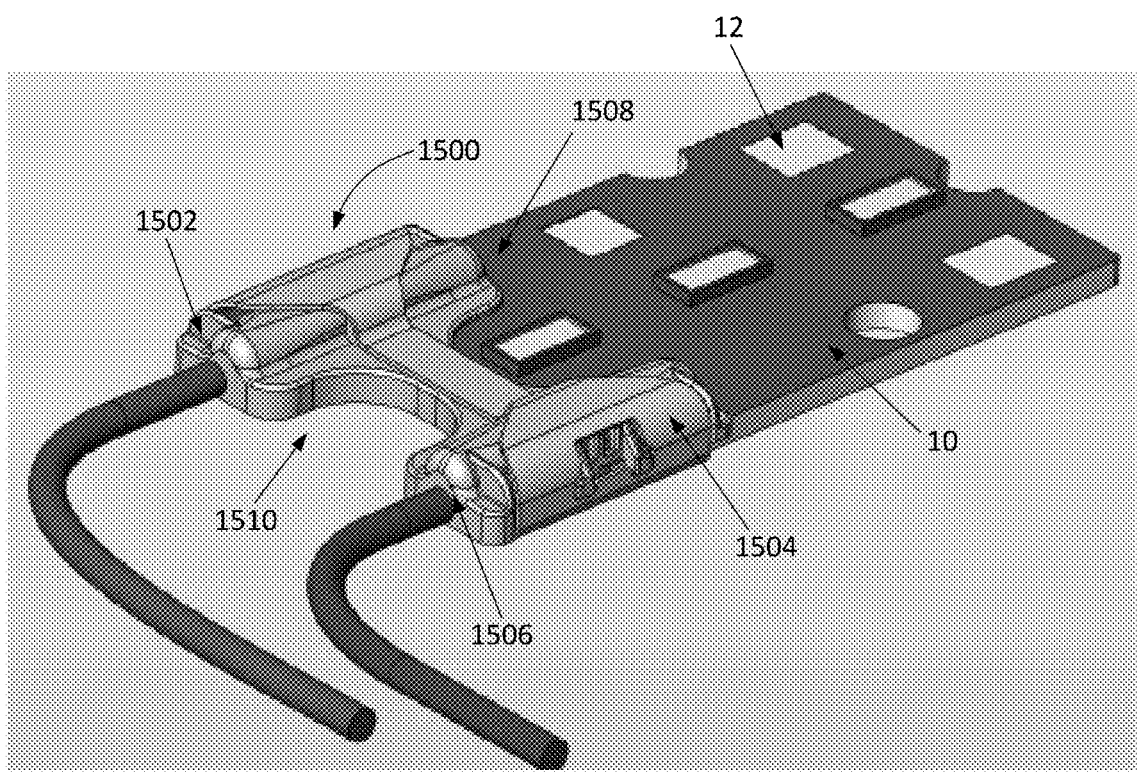
FIG. 15 is a perspective view of an exemplary end connector constructed according to the description which follows.

Turning to FIG. 15, there is illustrated an example end connector 1500 which, like the example connector 16 in FIGS. 1-14, includes a housing 1502 formed using an electrically insulating material such as, for example, plastic or the like, and an attachment element 1504. It will be understood that the end connector 1500 is intended to have the same general components and arrangement of components as described above so that the end connector 1500 is capable of being engaged with a PCB 10 using any of the methods described above. The example housing 1502, however, has conductor elements wherein one end of the conduct element is provided with the above described contact pad interface and wherein the other end of the conductor element is in the form of, or is coupled to, a wiring connection terminal 1506. One having ordinary skill in the art will appreciate that the wiring connection terminal 1506 may be, for example, a push-in type wiring connection terminal, a crimpable type wiring connection terminal, a solderable type wiring connection terminal, or the like. Thus, in this example, the end connector 1500 may be connected to power wires to thereby provide power to the PCBs that are placed into electrical engagement therewith.

Turning to FIG. 15, there is illustrated an example end connector 1500 which, like the example connector 16 in FIGS. 1-14, includes a housing 1502 formed using an electrically insulating material such as, for example, plastic or the like, and an attachment element 1504. It will be understood that the end connector 1500 is intended to have the same general components and arrangement of components as described above so that the end connector 1500 is capable of being engaged with a PCB 10 using any of the methods described above. The example housing 1502, however, has electrical terminals wherein one end of the electrical terminal is provided with the above described contact pad interface and wherein the other end of the electrical terminal is in the form of, or is coupled to, a wiring connection 1506. One having ordinary skill in the art will appreciate that the wiring connection 1506 may be, for example, a push-in type wiring connection, a crimpable type wiring connection, a solderable type wiring connection, or the like. Thus, in this example, the end connector 1500 may be connected to power wires to thereby provide power to the PCBs that are placed into electrical engagement therewith.

Figure 16:
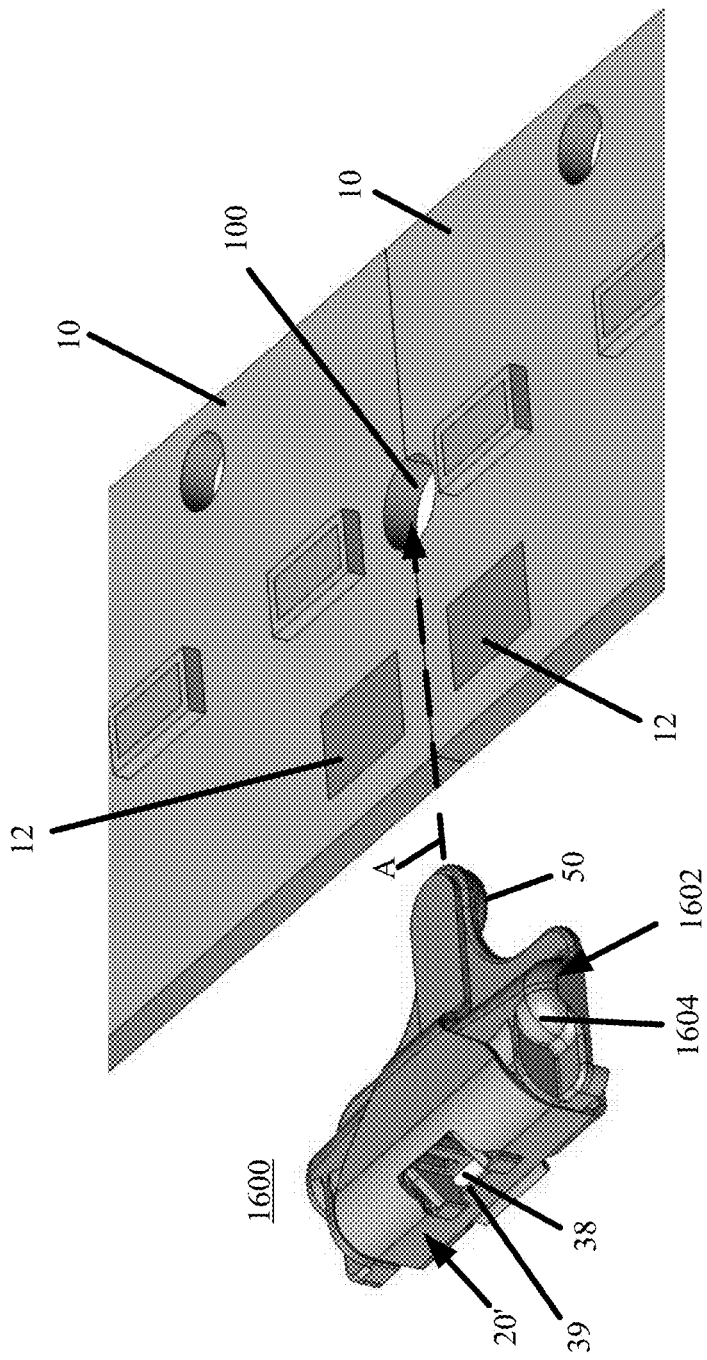
FIGS. 16 and 17 are perspective views of an exemplary connector constructed according to the description which follows.
Figure 17:
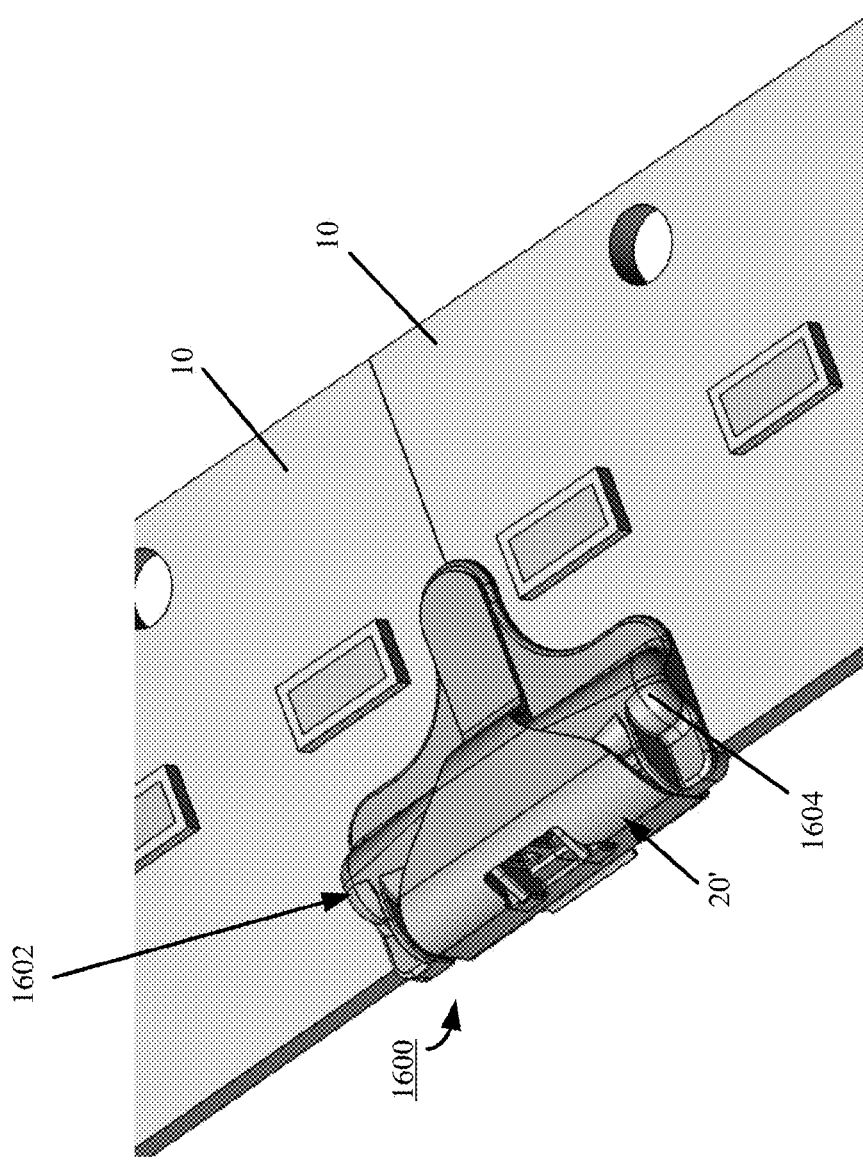
Figure 18:
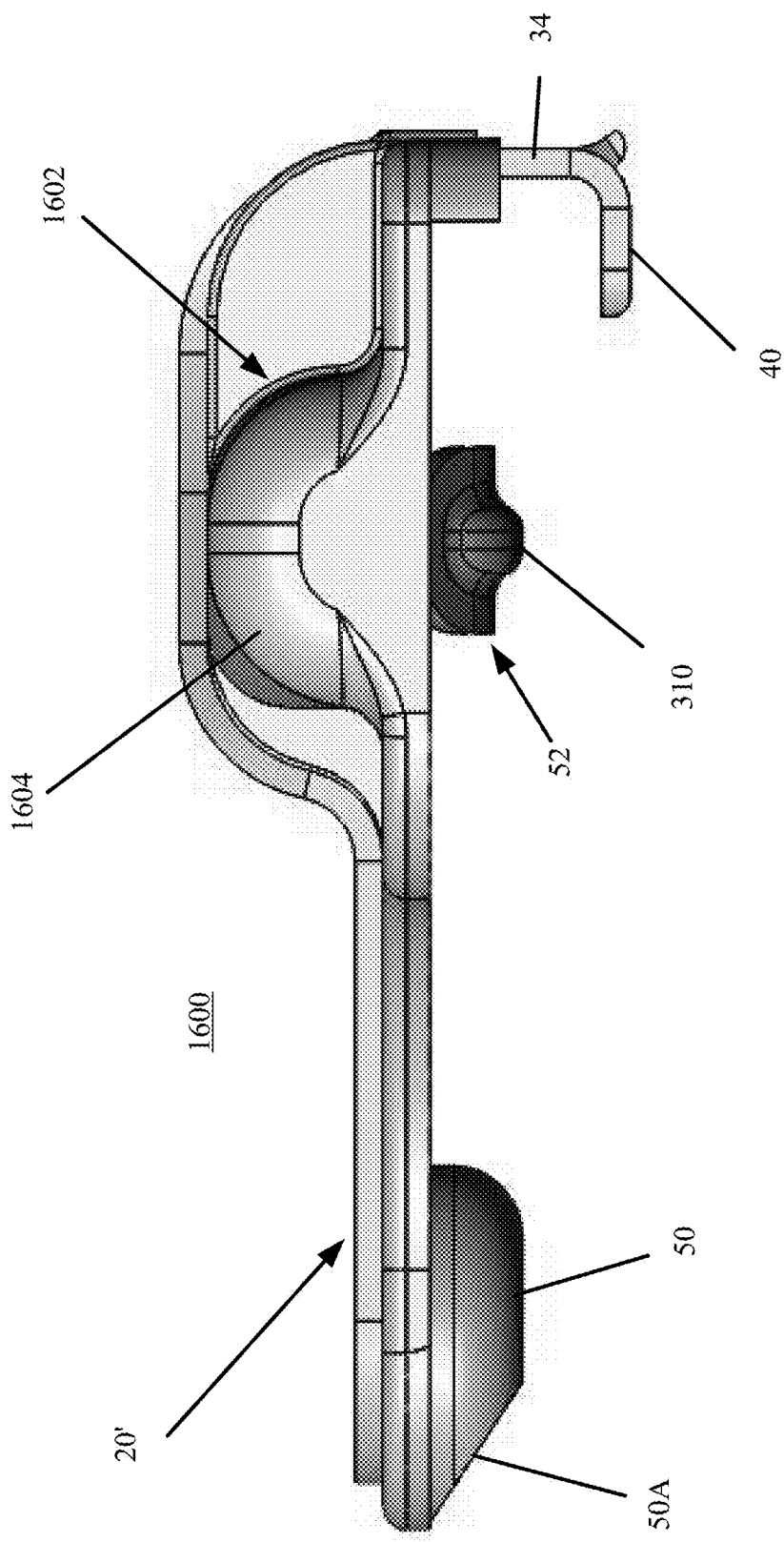
FIG. 18 is a side view of the connector of FIGS. 16 and 17.

Turning to FIGS. 16-18, there is illustrated an example single pole connector 1600 which, like the example connector 16 in FIGS. 1-14, includes a housing 1602 formed using an electrically insulating material such as, for example, plastic or the like, and an attachment element 20'. It will be understood that the connector 1600 is intended to have the same general components and arrangement of components as described above excepting that the connector 1600 is provided with a single domed housing element 1604 carrying a corresponding electrical terminal 52. Because the single pole connector 1600 need not span the entire width of the PCBs 10, the housing 1600 may terminate at the location of the alignment feature 50. As before, the alignment feature 50 is intended to cooperate with aperture 100 provided to the PCBs to inhibit relative movement of the connector 1600 relative to the PCBs 10. Similarly, because the single pole connector 1600 need not span the width entire width of the PCBs 10, the attachment element 20' may also terminate (i.e., be attached to the housing to the extent it is provided as a separate element) at the location of the alignment feature 50. As will be appreciated from the figures, the connector 1600 is mechanically and electrically coupled to the PCBs 10 via the attachment element 20' sandwiching the PCBs 10 as described above and via the PCBs 10 being further sandwiched between the alignment feature 50 and the end wall of the attachment element 20'. The connector 1600 can be attached to the PCBs 10 using the previously described rotational of vertical attachment methods. The connector 1600 can also be attached to the PCBs 10 by being slid thereon in a direction indicated by the arrow A of FIG. 16. In this sliding method of attachment, the edges of the PCBs 10 would be positioned within the attachment element 20' and the alignment feature 50 would be snap fit into the aperture 100. The alignment feature 50 may be provided with a profiled surface 50A to facilitate its insertion into the aperture 100 when this installation method is preferred.

Figure 19:
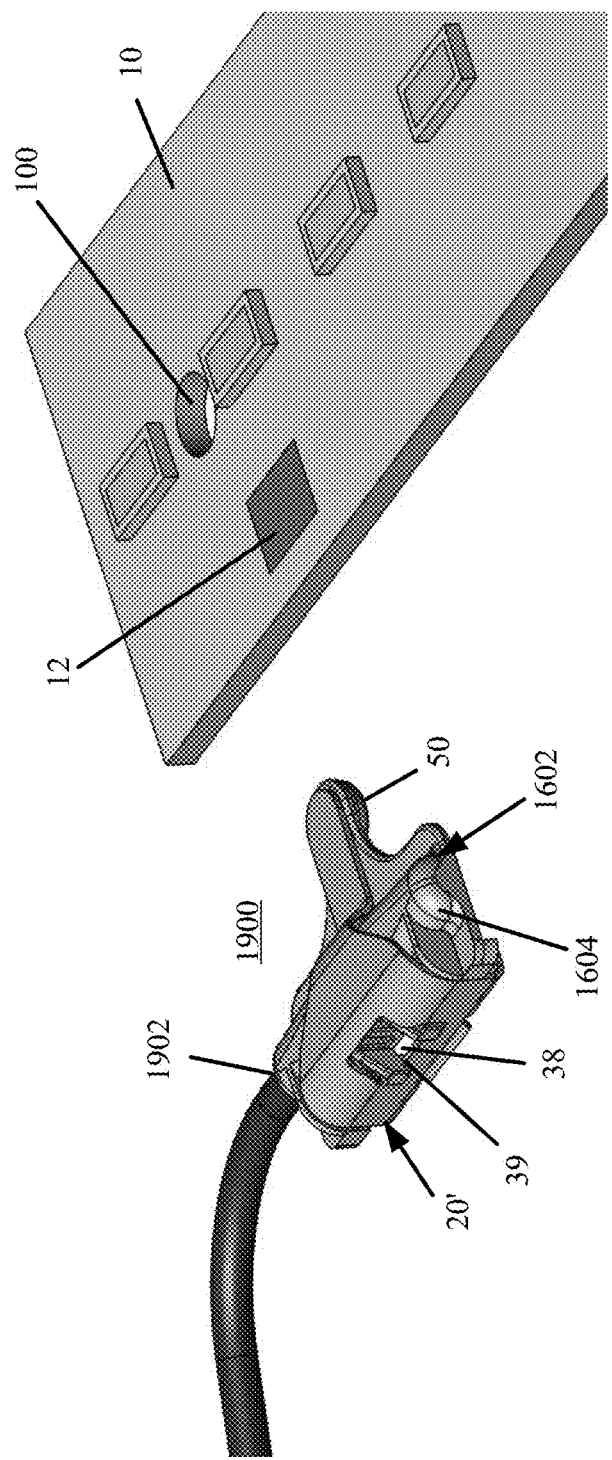
FIGS. 19, 20, and 21 are perspective views of a further exemplary connector constructed according to the description which follows.
Figure 20:
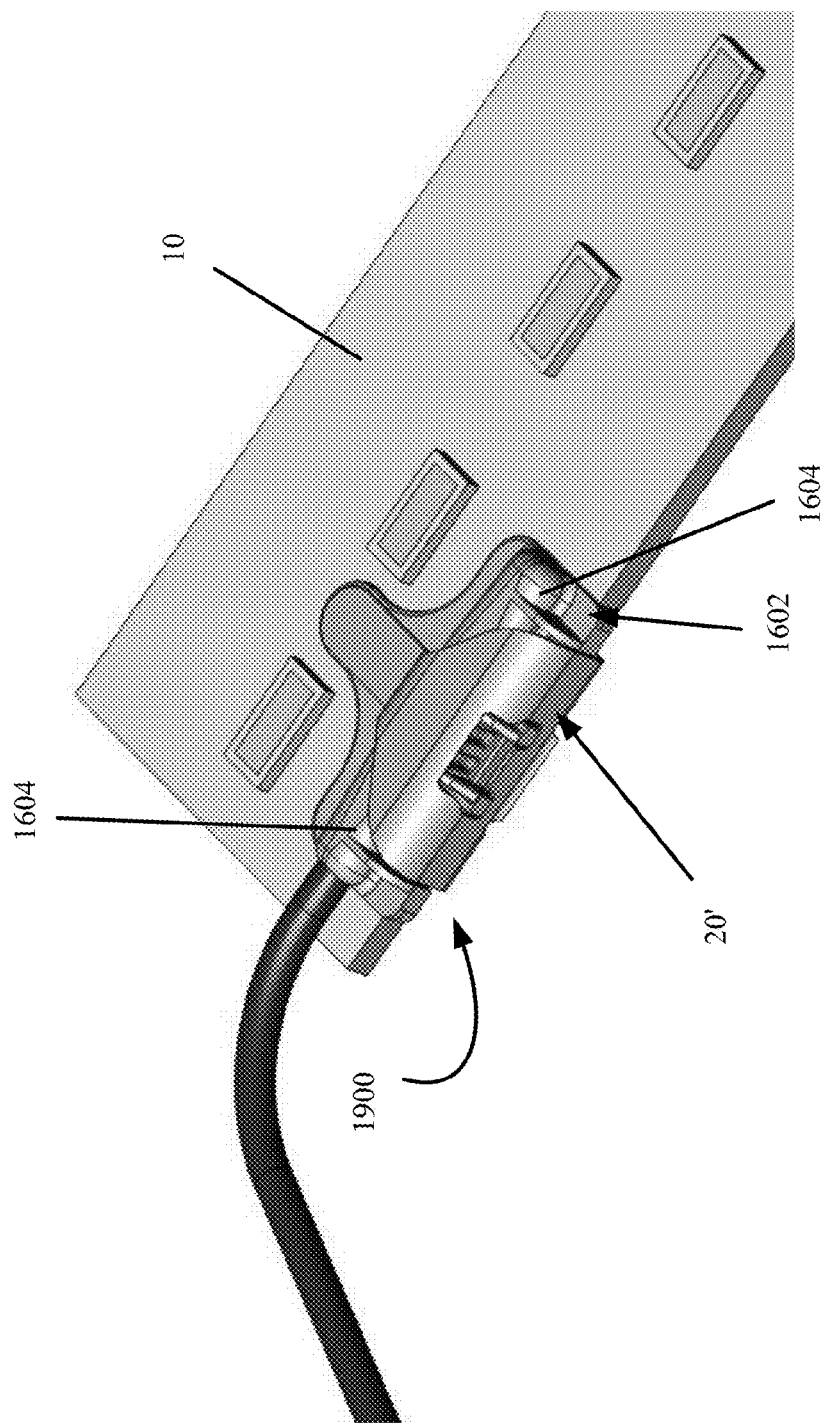
Figure 21:
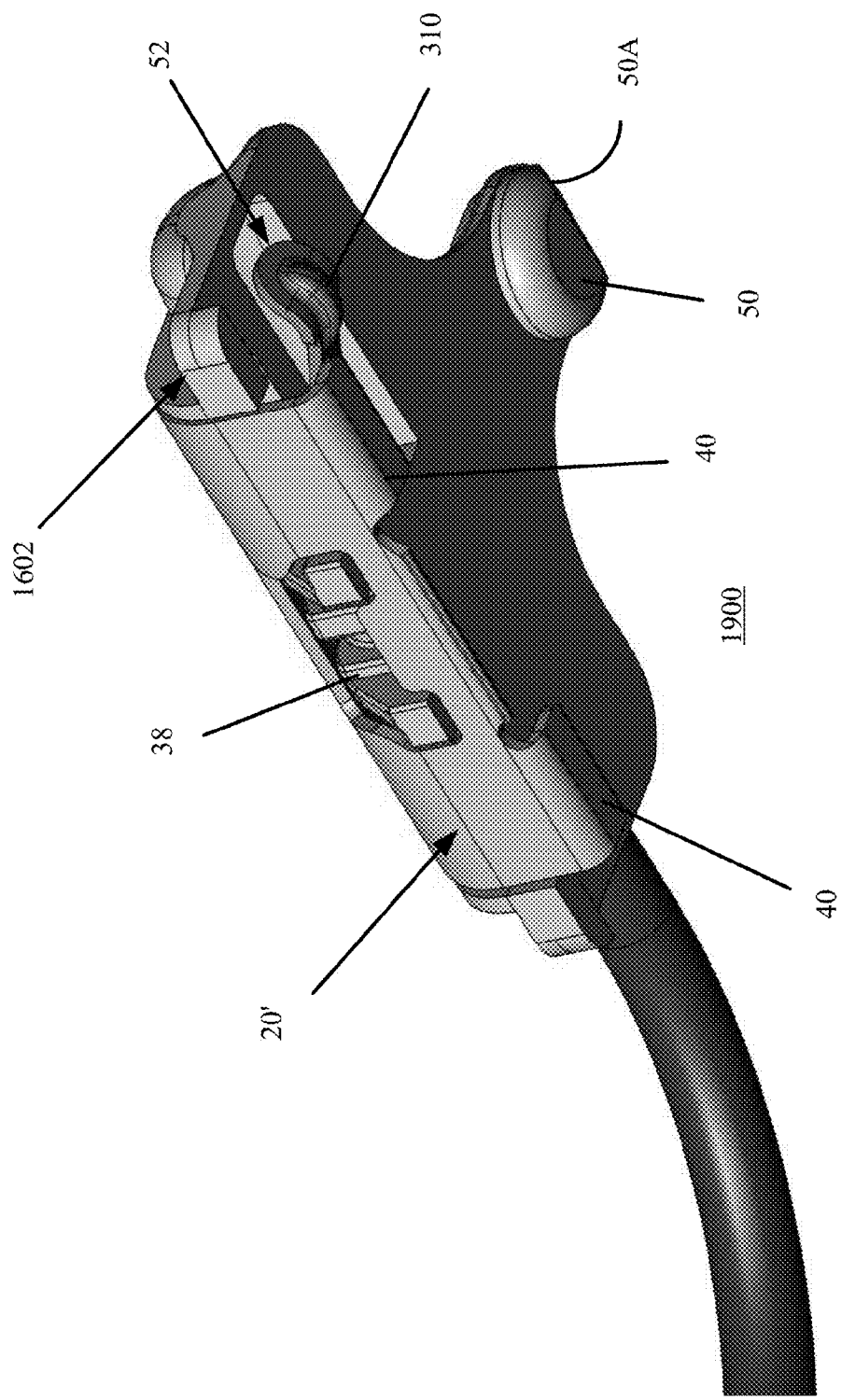

Turning to FIGS. 19-20, there is illustrated an example connector 1900 which is constructed similarly to the example connector 1600 in FIGS. 16-14 excepting that the connector 1900 includes an electrical terminal 52 wherein one end of the electrical terminal 52 is provided with the above described contact pad interface and wherein the other end of the electrical terminal is in the form of, or is coupled to, a wiring connection. As before, one having ordinary skill in the art will appreciate that the wiring connection may be, for example, a push-in type wiring connection, a crimpable type wiring connection, a solderable type wiring connection, or the like. It will also be appreciated that the housing 1602 in this example may be provided with an opening 1902 to facilitate the coupling of a wire and the electrical terminal 52.

Although certain example methods and apparatus have been described herein, the scope of coverage of this patent is not intended to be limited thereto. On the contrary, this patent is intended to cover all methods, apparatus, and articles of manufacture fairly falling within the scope of the appended claims either literally or under the doctrine of equivalents.

What is claimed is:

1. An electrical connector for use with at least one printed circuit board (PCB), comprising:
a body removably positionable over a top surface of the at least one PCB, the body having at least one electrical terminal wherein the at least one electrical terminal has at least one contact pad interface for engaging with a contact pad of the at least one PCB; and
a fastening element associated with the body, wherein the fastening element has a first side having a first element and second side having a second element, wherein the first and second sides are removably positionable adjacent to respective first and second sides of the at least one PCB and wherein the first element of the first side and the second element of the second side are arranged to inwardly extend from the respective first side and second side to resiliently engage a bottom surface of the at least one PCB to thereby mechanically and electrically couple the body and the at least one PCB without use of an additional fastening element,
wherein the body comprises at least two body portions and an intermediate body portion which is disposed intermediate the at least two body portions, and
wherein the intermediate body portion has a width that is less than a width of each of the body portions.

2. The electrical connector as recited in claim 1, wherein the body has an alignment feature sized and arranged to cooperate with a corresponding alignment feature provided to the at least one PCB to thereby inhibit movement of the body upon the top surface of the at least one PCB.

3. The electrical connector as recited in claim 1, wherein the fastening element is integrally formed with the body.

4. The electrical connector as recited in claim 1, wherein at least a portion of the fastening element comprises a resilient material.

5. The electrical connector as recited in claim 4, wherein the resilient material comprises a metallic material and wherein the body comprises an electrically insulating material.

6. The electrical connector as recited in claim 1, wherein at least the first side of the fastening element is deflectable to thereby allow the fastening element to be positioned relative to the at least one PCB by being rotated onto the at least one PCB.

7. The electrical connector as recited in claim 6, wherein the first side comprises an opening sized to accept a tool usable to deflect the first side when coupling the electrical connector to the at least one PCB or when removing the electrical connector from the at least one PCB.

8. The electrical connector as recited in claim 1, wherein the first side of the fastening element and the second side of the fastening element are each deflectable to thereby allow the fastening element to be positioned relative to the at least one PCB by being moved in a direction that generally towards the top surface of the at least one PCB.

9. The electrical connector as recited in claim 1, wherein the fastening element is positioned relative to the at least one PCB by having the at least one PCB slid between the body and the first element of the first side and the second elements of the second side.

10. The electrical connector as recited in claim 1, wherein a wiring connection is electrically coupled to the at least one electrical terminal.

11. The electrical connector as recited in claim 10, wherein the wiring connection comprises a push-in type wiring connection.

12. The electrical connector as recited in claim 1, wherein the intermediate body portion has a height that is less than a height of the each of the body portions.

13. An electrical connector for use with at least one printed circuit board (PCB), comprising:
a body positionable over a top surface of the at least one PCB, the body having at least two body portions in which each of is disposed an electrical terminal having at least one contact pad interface for engaging with a corresponding contact pad of the at least one PCB and an intermediate body portion which is disposed intermediate the at least two body portion wherein the intermediate body portion has a width that is less than a width of the at least two body portions.

14. The electrical connector as recited in claim 13, wherein the body has an associated fastening element for releasably coupling the body over the top surface of the at least one PCB and for engaging with a bottom surface of the at least one PCB.

15. The electrical connector as recited in claim 14, wherein the body and associated fastening element are arranged to slidingly receive therebetween the at least one PCB.

16. The electrical connector as recited in claim 14, wherein the fastening element is integrally formed with the body.

17. The electrical connector as recited in claim 14, wherein at least a portion of the fastening element comprises a resilient material.

18. The electrical connector as recited in claim 17, wherein the resilient material comprises a metallic material and wherein the body comprises an electrically insulating material.

19. The electrical connector as recited in claim 14, wherein at least a first side of the fastening element positionable adjacent to a corresponding side surface of the at least one PCB and having an element for engaging with the bottom surface of the at least one PCB is deflectable to thereby allow the electrical connector to be positioned relative to the at least one PCB by being rotated onto the at least one PCB.

20. The electrical connector as recited in claim 19, wherein the first side comprises an opening sized to accept a tool usable to deflect the first side when coupling the electrical connector to the at least one PCB or when removing the electrical connector from the at least one PCB.

21. The electrical connector as recited in claim 14, wherein a first side of the fastening element positionable adjacent to a corresponding first side surface of the at least one PCB and having an element for engaging with the bottom surface of the at least one PCB and a second side of the fastening element positionable adjacent to a corresponding second side surface of the at least one PCB and having an element for engaging with the bottom surface of the at least one PCB are each deflectable to thereby allow the electrical connector to be positioned relative to the at least one PCB by being moved in a direction that is generally towards a top surface of the at least one PCB.

22. The electrical connector as recited in claim 13, wherein the electrical terminal of at least one of the two body portions is coupled to a wiring connection.

23. The electrical connector as recited in claim 22, wherein the wiring connection comprises a push-in type wiring connection.

24. The electrical connector as recited in claim 13, wherein the electrical terminal of at least one of the two body portions has at opposed ends thereof a contact pad interface for engaging with a corresponding contact pad of the at least one PCB.

25. An electrical connector for use with at least one printed circuit board (PCB), comprising:
a body positionable over a top surface of the at least one PCB, the body having at least two body portions in which each of is disposed an electrical terminal having at least one contact pad interface for engaging with a corresponding contact pad of the at least one PCB and an intermediate body portion which is disposed intermediate the at least two body portion wherein the intermediate body portion has a height that is less than a height of the at least two body portions, and wherein the intermediate body portion has a width that is less than a width of the at least two body portions.

26. The electrical connector as recited in claim 25, wherein the body has an associated fastening element for releasably coupling the body over the top surface of the at least one PCB and for engaging with a bottom surface of the at least one PCB.

27. The electrical connector as recited in claim 26, wherein the body and associated fastening element are arranged to slidingly receive therebetween the at least one PCB.

28. The electrical connector as recited in claim 26, wherein the fastening element is integrally formed with the body.

29. The electrical connector as recited in claim 26, wherein at least a portion of the fastening element comprises a resilient material.

30. The electrical connector as recited in claim 29, wherein the resilient material comprises a metallic material and wherein the body comprises an electrically insulating material.

31. The electrical connector as recited in claim 26, wherein at least a first side of the fastening element positionable adjacent to a corresponding side surface of the at least one PCB and having an element for engaging with the bottom surface of the at least one PCB is deflectable to thereby allow the electrical connector to be positioned relative to the at least one PCB by being rotated onto the at least one PCB.

32. The electrical connector as recited in claim 31, wherein the first side comprises an opening sized to accept a tool usable to deflect the first side when coupling the electrical connector to the at least one PCB or when removing the electrical connector from the at least one PCB.

33. The electrical connector as recited in claim 26, wherein a first side of the fastening element positionable adjacent to a corresponding first side surface of the at least one PCB and having an element for engaging with the bottom surface of the at least one PCB and a second side of the fastening element positionable adjacent to a corresponding second side surface of the at least one PCB and having an element for engaging with the bottom surface of the at least one PCB are each deflectable to thereby allow the electrical connector to be positioned relative to the at least one PCB by being moved in a direction that is generally towards a top surface of the at least one PCB.

34. The electrical connector as recited in claim 25, wherein the electrical terminal of at least one of the two body portions is coupled to a wiring connection.

35. The electrical connector as recited in claim 34, wherein the wiring connection comprises a push-in type wiring connection.

36. The electrical connector as recited in claim 25, wherein the electrical terminal of at least one of the two body portions has at opposed ends thereof a contact pad interface for engaging with a corresponding contact pad of the at least one PCB.

37. An electrical connector for use with at least one printed circuit board (PCB), comprising:
a body removably positionable over a top surface of the at least one PCB, the body having at least one electrical terminal, wherein the at least one electrical terminal has at least one contact pad interface for engaging with a contact pad of the at least one PCB, and an alignment feature sized and arranged to cooperate with a corresponding alignment feature provided to the at least one PCB to thereby inhibit movement of the body upon the top surface of the at least one PCB; and
a fastening element associated with the body, wherein the fastening element having at least one side having an element wherein the at least one side is removably positionable adjacent to a respective side of the at least one PCB and wherein the element of the at least one side is arranged to inwardly extend from the side to engage a bottom surface of the at least one PCB to thereby mechanically and electrically couple the body and the at least one PCB without use of an additional fastening element,
wherein the body comprises at least one body portion in which is disposed the at least one electrical terminal and an intermediate body portion which couples the at least one body portion to the alignment feature, and
wherein the intermediate body portion has a width that is less than a width of the at least one body portion.

38. The electrical connector as recited in claim 37, wherein the alignment feature has an angled surface to assist in slidingly coupling the electrical connector to the at least one PCB.

39. The electrical connector as recited in claim 37, wherein the fastening element is integrally formed with the body.

40. The electrical connector as recited in claim 37, wherein at least a portion of the fastening element comprises a resilient material.

41. The electrical connector as recited in claim 40, wherein the resilient material comprises a metallic material and wherein the body comprises an electrically insulating material.

42. The electrical connector as recited in claim 37, wherein the at least one side of the fastening element is deflectable to thereby allow the fastening element to be positioned relative to the at least one PCB by being rotated onto the at least one PCB or by being positioned relative to the at least one PCB by being moved in a direction that generally towards the top surface of the at least one PCB.

43. The electrical connector as recited in claim 42, wherein the at least one side comprises an opening sized to accept a tool usable to deflect the at least one side when coupling the electrical connector to the at least one PCB or when removing the electrical connector from the at least one PCB.

44. The electrical connector as recited in claim 37, wherein a wiring connection is electrically coupled to the at least one electrical terminal.

45. The electrical connector as recited in claim 44, wherein the wiring connection comprises a push-in type wiring connection.

46. The electrical connector as recited in claim 37, wherein the intermediate body portion has a height that is less than a height of the at least one body portion.

\* \* \* \* \*